(12) United States Patent
Saito

(10) Patent No.: US 7,968,254 B2
(45) Date of Patent: Jun. 28, 2011

(54) PHOTOMASK RETICLE FOR USE IN PROJECTION EXPOSURE, AND MANUFACTURING METHODS THEREFOR

(75) Inventor: Masayoshi Saito, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 519 days.

(21) Appl. No.: 12/078,564

(22) Filed: Apr. 1, 2008

(65) Prior Publication Data
US 2008/0261124 A1 Oct. 23, 2008

(30) Foreign Application Priority Data

Apr. 2, 2007 (JP) ................................ 2007-096328

(51) Int. Cl.
*G03F 1/00* (2006.01)
(52) U.S. Cl. ......................................................... 430/5
(58) Field of Classification Search .................... 430/5
See application file for complete search history.

(56) References Cited

U.S. PATENT DOCUMENTS

| | | | | |
|---|---|---|---|---|
| 5,229,255 A * | 7/1993 | White | ............................. | 430/5 |
| 5,429,897 A * | 7/1995 | Yoshioka et al. | ............... | 430/5 |
| 6,558,853 B1 * | 5/2003 | Kawamura | ...................... | 430/5 |
| 2004/0219435 A1 * | 11/2004 | Wu et al. | ......................... | 430/5 |
| 2005/0026050 A1 | 2/2005 | Ozawa et al. | | |
| 2005/0227151 A1 * | 10/2005 | Hata et al. | ........................ | 430/5 |
| 2006/0197934 A1 | 9/2006 | Yamazoe | | |
| 2008/0050661 A1 * | 2/2008 | Kumar | ............................ | 430/5 |

FOREIGN PATENT DOCUMENTS

| | | |
|---|---|---|
| JP | 2001-296647 | 10/2001 |
| JP | 2003-233165 | 8/2003 |
| JP | 2004-309958 | 11/2004 |
| JP | 2005-258387 | 9/2005 |
| JP | 2006-245115 | 9/2006 |

* cited by examiner

*Primary Examiner* — Mark F Huff
*Assistant Examiner* — John Ruggles
(74) *Attorney, Agent, or Firm* — McGinn IP Law Group, PLLC

(57) ABSTRACT

A photomask reticle for use in projection exposure to form a resist pattern on a workable film formed over a semiconductor substrate, includes a first area in which a light shield is formed, a second area formed around said first area, a third area formed around said second area; and a fourth area formed around said third area, the areas being formed over a substrate, a relationship between transmissivities of said areas being second area transmissivity>fourth area transmissivity>third area transmissivity>first area transmissivity.

18 Claims, 21 Drawing Sheets

SCANNING DIRECTION

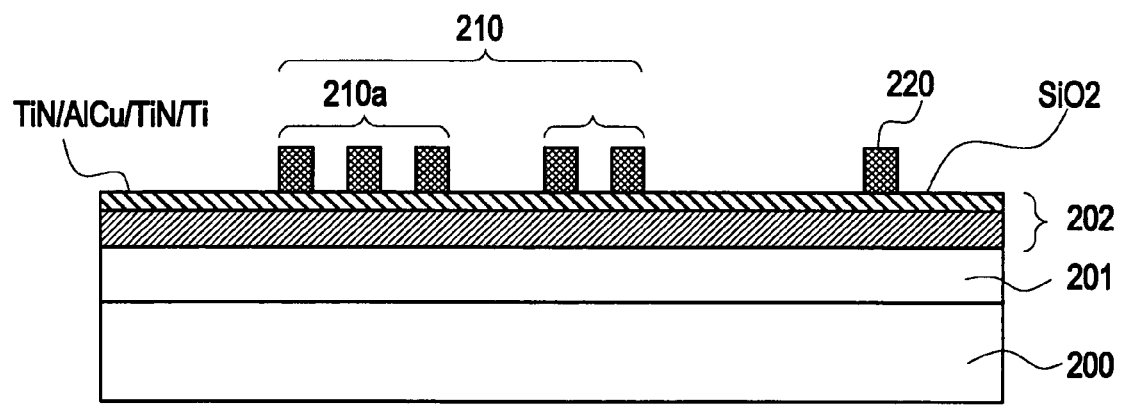

PHOTOMASK RETICLE FOR USE IN PROJECTION EXPOSURE, AND MANUFACTURING METHODS THEREFOR

This application is based upon and claims the benefit of priority from Japanese patent application No. 2007-096328, filed on Apr. 2, 2007, the disclosure of which is incorporated herein in its entirety by reference.

BACKGROUND OF THE INVENTION

1. Field of the Invention

The present invention relates to a photomask reticle for use in projection exposure, a method of manufacturing the reticle for projection exposure and a method of manufacturing a semiconductor device using the reticle.

2. Description of the Related Art

Along with the development of technology over the recent years, miniaturization of element dimensions is called for to achieve higher performance and higher density semiconductor devices. In order to shape a micro-pattern, it is necessary to use short-wavelength ultraviolet rays or the like, utilize their interference or correct their proximity effect.

For instance, there is a patterning method using an attenuated halftone phase shift mask as a technique to utilize a phase difference of light to cancel a lag of half a wavelength.

Japanese Patent Application Laid-Open No. 2001-296647 describes a hole patterning technique using a halftone phase shift mask. In FIG. 1, FIG. 2 and paragraph [0010] of Japanese Patent Application Laid-Open No. 2001-296647, an invention which is intended to reduce side lobes by disposing a light shield area between the aperture and the halftone part of a halftone phase shift mask is disclosed.

FIG. 1 of Japanese Patent Application Laid-Open No. 2003-233165 illustrates a dummy hole pattern in a photomask reticle (mask) having a hole pattern.

Japanese Patent Application Laid-Open No. 2004-309958 describes a halftone phase shift mask, and FIG. 6 through FIG. 8 and paragraph [0010] of the same refer to the arrangement of a phase shifter area of high transmissivity in the peripheries of a main pattern. FIG. 8 and FIG. 9 illustrate a bar-shaped auxiliary pattern, which is also found in FIG. 15.

Japanese Patent Application Laid-Open No. 2005-258387 describes a binary gray tone mask; FIG. 1 and paragraph [0020] refer to obtaining a medium tone by arranging a plurality of light shields in an equal pitch.

However, this involves a problem that, where a photomask reticle having dense and isolated main light shield patterns is used, the width of the resist pattern that is formed becomes thin.

FIG. 1 shows an example of a conventional photomask reticle. Reticle 400 has dense pattern 410 and isolated pattern 420. Dense pattern 410 is a pattern having a plurality of chromium light shields 402 densely concentrated over a transparent substrate 401. Isolated pattern 420 is a pattern comprising single chromium light shield 402 formed in a position away from dense pattern 410.

FIG. 2 shows positive-type resist patterns formed over a semiconductor substrate by projection exposure using the reticle of FIG. 1. Out of the patterns formed over semiconductor substrate 501, thinning patterns 530 are formed as the sub-patterns at the two ends of dense pattern 510 and as isolated pattern 520.

As a method to restrain the thinning of the isolated pattern and the outermost sub-patterns of the dense pattern, a method of arranging bar-shaped patterns 610 which are not resolved (transferred) outside the dense and isolated patterns as shown in FIG. 3 is disclosed as a technique related to a prior art.

FIG. 4A is a plan showing reticle 650 in which unresolved auxiliary patterns 610 are formed along two sides of single light shield 602, and FIG. 4B shows a section along line A-B in FIG. 4A. The light transmissivity distribution in this reticle is shown in FIG. 4C, and the light intensity distribution in the same, in FIG. 4D. Since the restraint on the straying-in of light ray due to diffraction is not yet sufficient in such a photomask reticle, the thinning of the isolated pattern is still significant. Accordingly, the depth of focus (DOF) is shallow. Thus the effect of the auxiliary pattern is limited, leaving the problem that it is impossible to form lines of the same thickness in the isolated and dense patterns.

SUMMARY OF THE INVENTION

In view of these circumstances, the present invention is intended to provide a photomask reticle for use in projection exposure which can substantially restrain the thinning of the isolated pattern, a method of manufacturing the reticle for projection exposure and a method of manufacturing a semiconductor device using the reticle.

To achieve the object stated above, a photomask reticle for use in projection exposure according to the invention is a photomask reticle for use in projection exposure which forms a resist pattern on a workable film formed over a semiconductor substrate, comprising a first area in which a light shield is formed; a second area formed around the first area; a third area formed around the second area; and a fourth area formed around the third area, the areas being formed over a substrate, the relationship among the areas in terms of transmissivity, is second area>fourth area>third area>first area.

The reticle according to the invention is provided further with the third area and the fourth area around the second area. The relationship among the areas transmissivity is second area>fourth area>third area>first area. By forming areas having such a transmissivity relationship, the reticle according to the invention can restrain the straying-in of light due to diffraction, and therefore the thinning of the resist pattern can be kept smaller than where thin bar-shaped patterns are used.

The reticle according to the invention may further comprise dense patterns made up of a plurality of the first areas formed adjacent to one another and an isolated pattern made up of one pattern in the first area, wherein the dense patterns and the isolated pattern are independently formed in positions apart from each other. In this case, the thinning of the isolated pattern can be substantially restrained.

In the reticle according to the invention, a plurality of unresolved micro light shields may be arranged in the third area and in the fourth area.

In the reticle according to the invention, the plurality of micro light shields may be arranged with random. In this case, the effect of interference can be sufficiently reduced.

In the reticle according to the invention, the shapes of the plurality of micro light shields as projected in the direction normal to the main face of the substrate may include congruent or similar ones.

In the reticle according to the invention, a height of the plurality of micro light shields may be less than a height of the light shield in the first area. In this case, by suppressing the height of the plurality of micro light shields for transmissivity adjustment, the micro light shields can be prevented from falling down during the reticle fabrication process.

In the reticle according to the invention, the first area may include a halftone including a plurality of light shields having an attenuated phase part not less than 3% but not more than 12% in transmissivity, and light rays passing through the plurality of light shields of the halftone and light rays passing through the second area are different in phase. In this case, since light rays different in phase work so as to weaken the amplitude of each other on the boundary between the areas, the edges of patterns that are formed are sharp.

In the reticle according to the invention, a plurality of light shields differing in transmissivity may be formed in the first area, and the plurality of light shields may be so arranged that their transmissivity increases in as the shields approach the second area.

In the reticle according to the invention, a pattern ratio in a scanning direction of the resist pattern on the semiconductor substrate obtained by scanning the reticle and a pattern ratio in the scanning direction of the first area, the second area, the third area and the fourth area may be different. In particular, by keeping the pattern ratio in the scanning direction of the first through fourth areas greater, the pattern accuracy in the scanning direction can be enhanced.

A method of manufacturing the reticle for projection exposure according to the invention includes forming a light shield layer over the substrate; forming a resist layer over the light shield layer; forming, in said resist layer, a resist mask having patterns which form the first area, the third area and the fourth area; and removing the resist layer after transferring the patterns formed by the resist mask to the light shield layer.

A method of manufacturing the reticle for use in projection exposure according to the invention comprises forming a light shield layer over the substrate; forming an intermediate mask layer over the light shield layer; forming a resist layer over the intermediate mask layer; forming resist masks in the resist layer patterns which form the first area, the third area and the fourth area; removing the resist layer after transferring the patterns formed by the resist masks to the intermediate mask layer; and removing the intermediate mask layer after further transferring to the light shield layer the patterns transferred to the intermediate mask layer.

A method of manufacturing a semiconductor device according to the invention comprises forming a workable film over a semiconductor substrate; and forming the resist pattern over the workable film by projection exposure of the reticle.

Since the reticle according to the invention can restrain the straying-in of light due to diffraction, the thinning of the resist pattern can be restrained more effectively where a thin bar-shaped pattern is used.

The above and other objects, features, and advantages of the present invention will become apparent from the following description with reference to the accompanying drawings, which illustrate examples of the present invention.

BRIEF DESCRIPTION OF THE DRAWINGS

FIG. 15 is a sectional view of the semiconductor device in the fabrication process shown in FIG. 14.

DETAILED DESCRIPTION OF THE EXEMPLARY EMBODIMENTS

Next, exemplary embodiments of the invention will be described with reference to the accompanying drawings.

Exemplary Embodiment 1

This exemplary embodiment pertains to pattern formation by transmissivity control of conventional light shields and peripheral areas.

Figure 1:
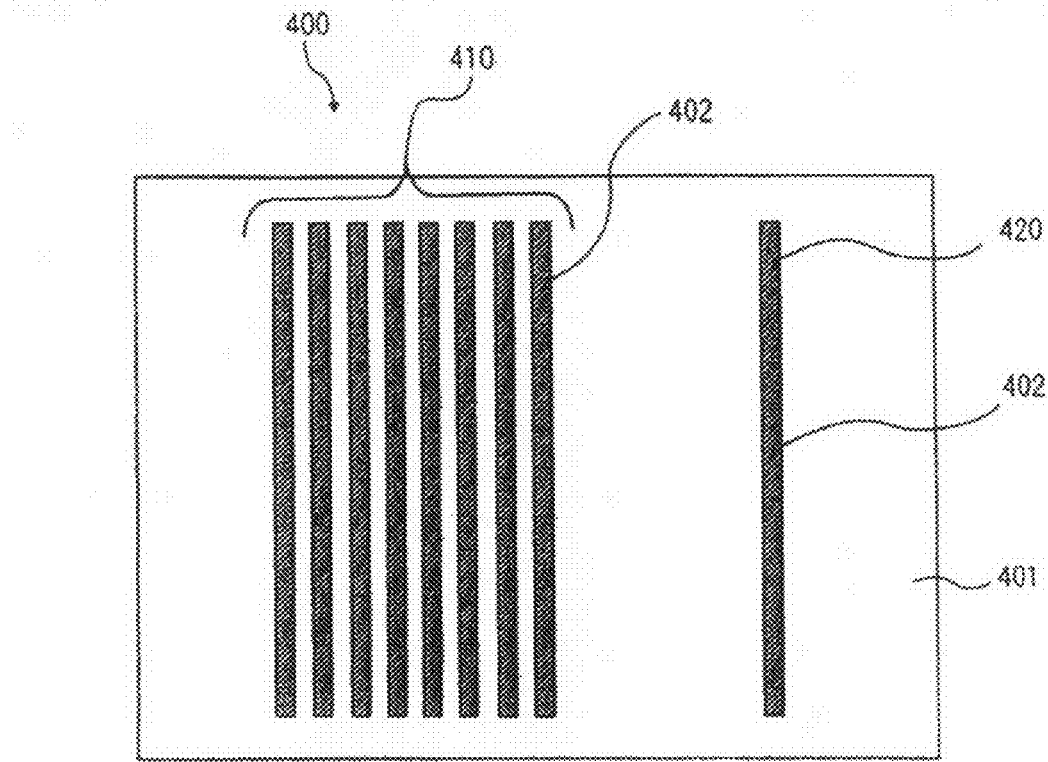
FIG. 1 shows a plan of an example of a conventional photomask reticle.
Figure 2:
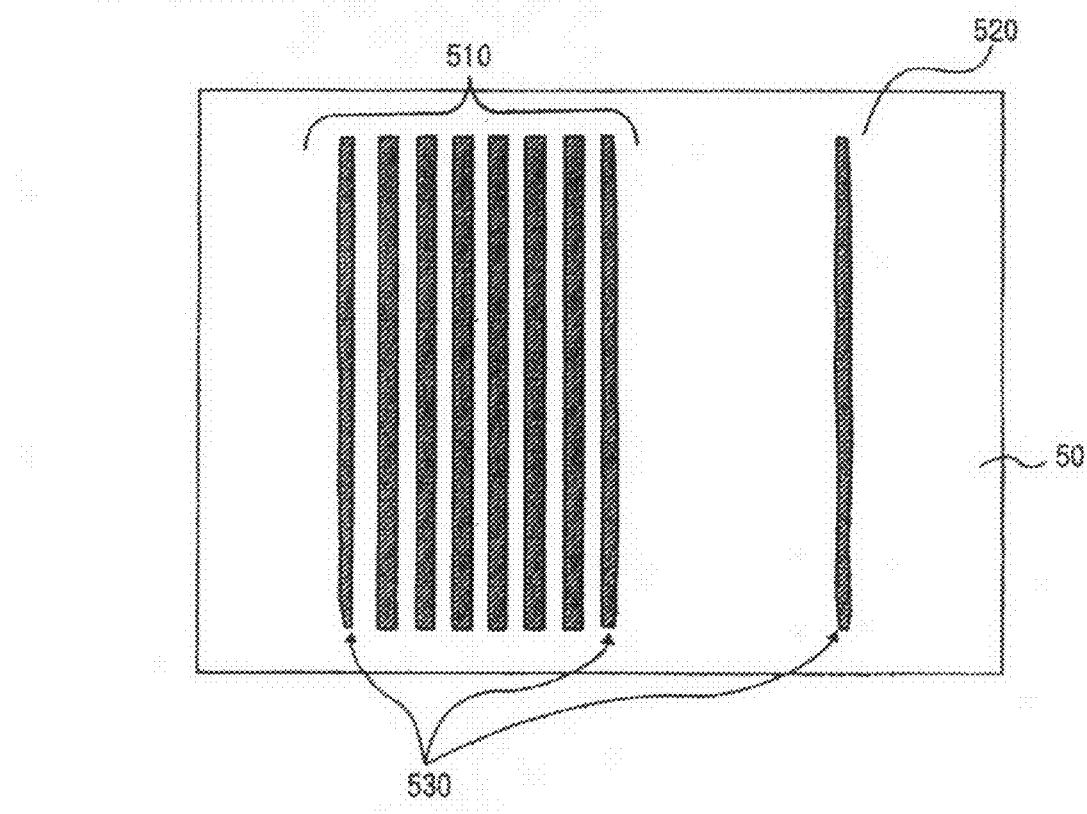
FIG. 2 shows resist patterns formed over a semiconductor substrate by projection exposure using the reticle of FIG. 1.
Figure 3:
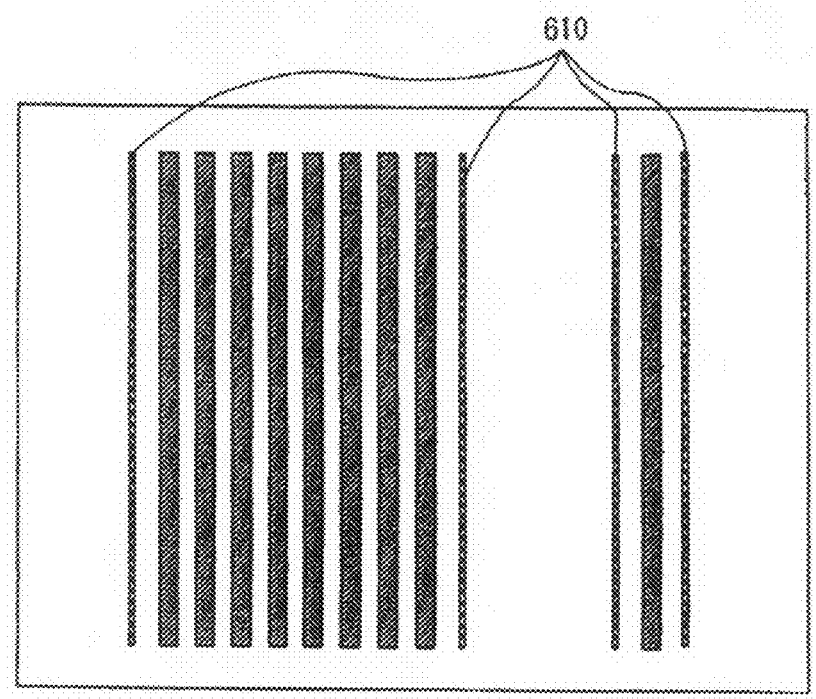
FIG. 3 shows a plan showing an example of a conventional photomask reticle provided with bar-shaped patterns.
Figure 4A:
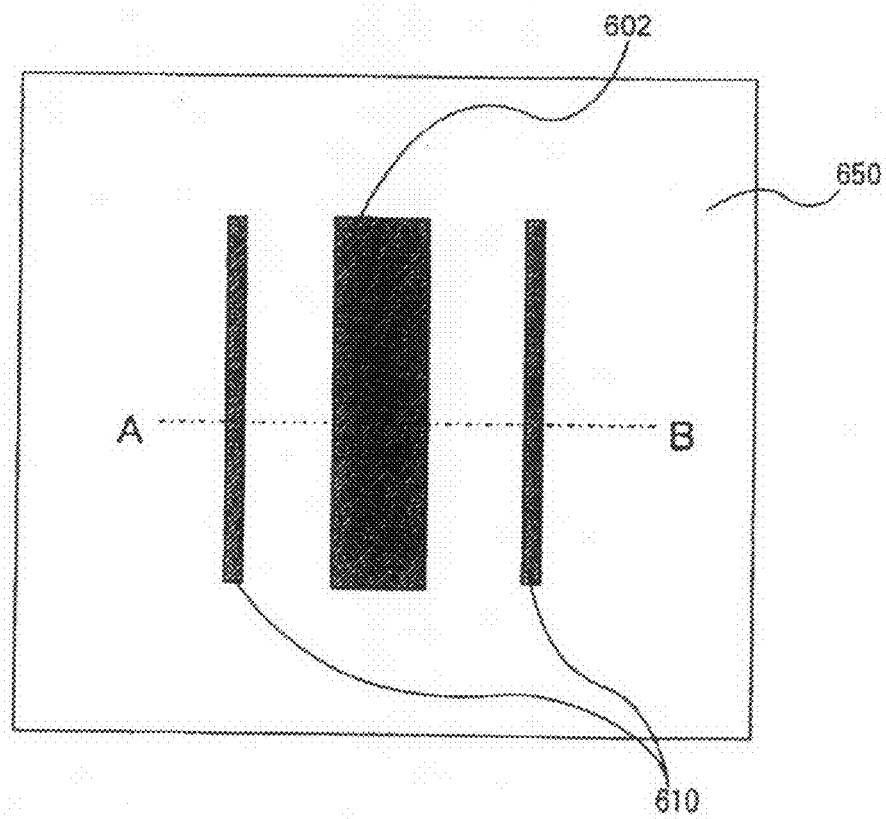
FIG. 4A is a plan showing the essential part of a conventional photomask reticle.
Figure 4B:
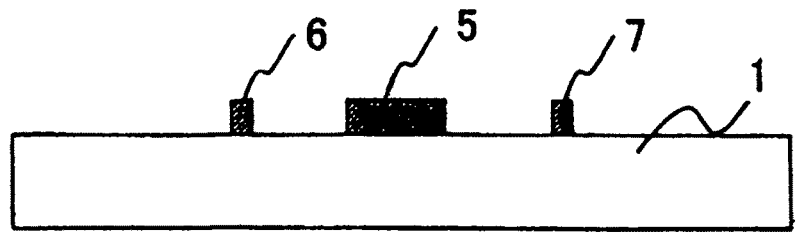
FIG. 4B shows a section along line A-B in FIG. 4A.
Figure 4C:
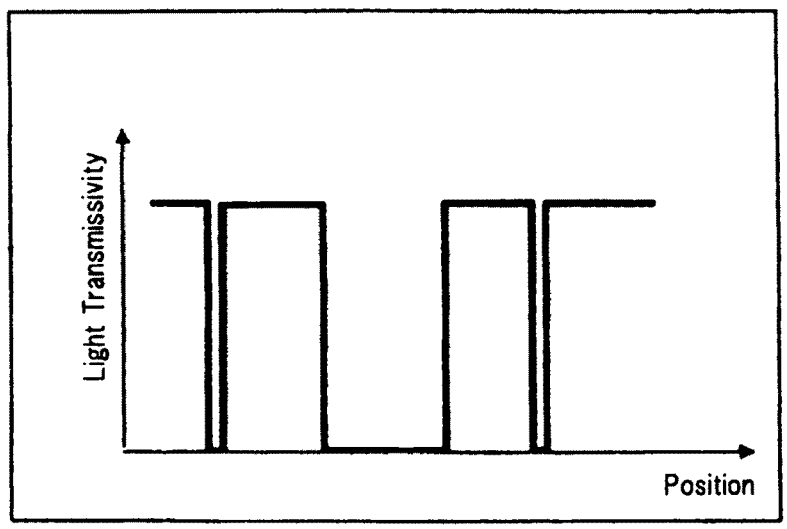
FIG. 4C is a graph showing the light transmissivity distribution of light rays having passed through the patterns areas shown in FIG. 4A.
Figure 4D:
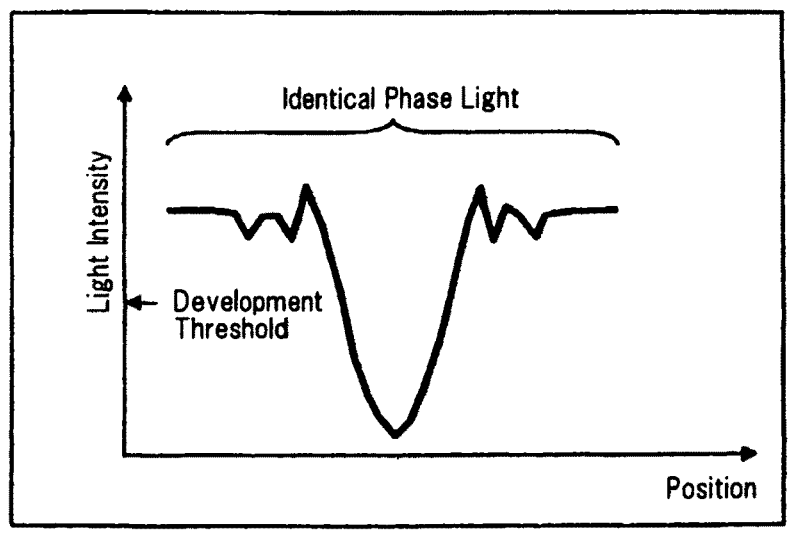
FIG. 4D is a graph showing the light intensity distribution of light rays on the surface of the substrate having passed through the patterns areas shown in FIG. 4A.
Figure 5A:
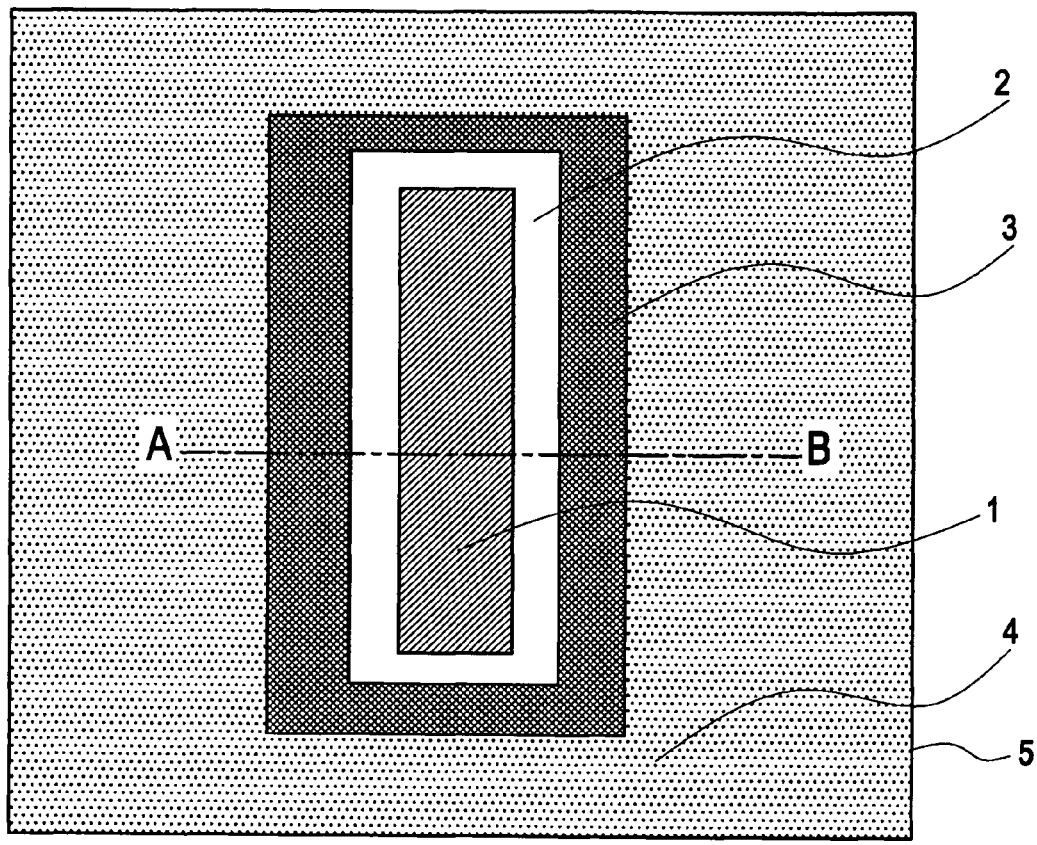
FIG. 5A is a plan showing the essential part of a photomask reticle in Exemplary Embodiment 1 of the invention.

FIG. 5A is a plan showing the essential part of a mask (reticle) in this exemplary embodiment. In area 1 over transparent substrate 5, a light shield which is to make up the main pattern is arranged. Around area 1, area 2 which is highest in transmissivity is arranged. Around area 2, area 3 which is lower in transmissivity is arranged. The width of this area 3 is greater than that of the bar-shaped pattern according to the art related to the invention. Farther outside area 3, area 4 is arranged. Area 4 has an intermediate transmissivity lower than area 2 but higher than area 3.

Figure 5B:
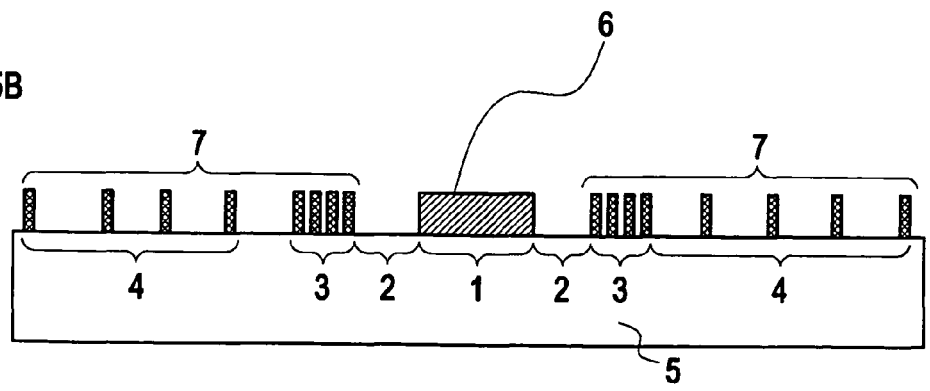
FIG. 5B shows a section along line A-B in FIG. 5A.

A section along line A-B in FIG. 5A is shown in FIG. 5B. Main pattern 6 is formed in area 1 of substrate 5, auxiliary patterns 7 are formed in area 3 and area 4. Main pattern 6 in area 1 is formed of a light shield. No light shield is arranged in area 2 around area 1. Area 3 around area 2 is formed of micro-patterns which do not resolve but reduce the transmissivities of light rays (including ultraviolet rays, UV rays even shorter in wavelength and energy rays such as X-rays besides visible light rays). In area 4 farther outside area 3, micro-patterns are arranged in suitable size and at suitable intervals to position their substantial transmissivity at an intermediate value between those of area 2 and area 3.

Figure 5C:
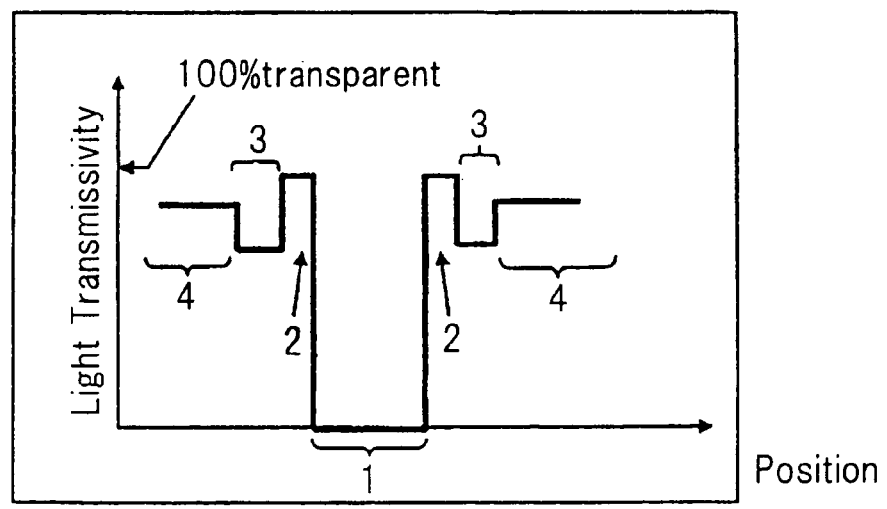
FIG. 5C is a graph showing light transmissivity distribution of light rays having passed through the patterns areas shown in FIG. 5A.

Light rays having passed through the patterns areas of FIG. 5A have the light transmissivity distribution shown in FIG. 5C. The light transmissivity is nearly 0% in area 1 and nearly 100% in area 2. In area 3 and area 4, which do transmit light, the light transmissivity of area 4 is somewhere between area 2 and area 3. Thus, the light transmissivity relationship among areas 1 through 4 is:

Area 2>area 4>area 3>area 1

Figure 5D:
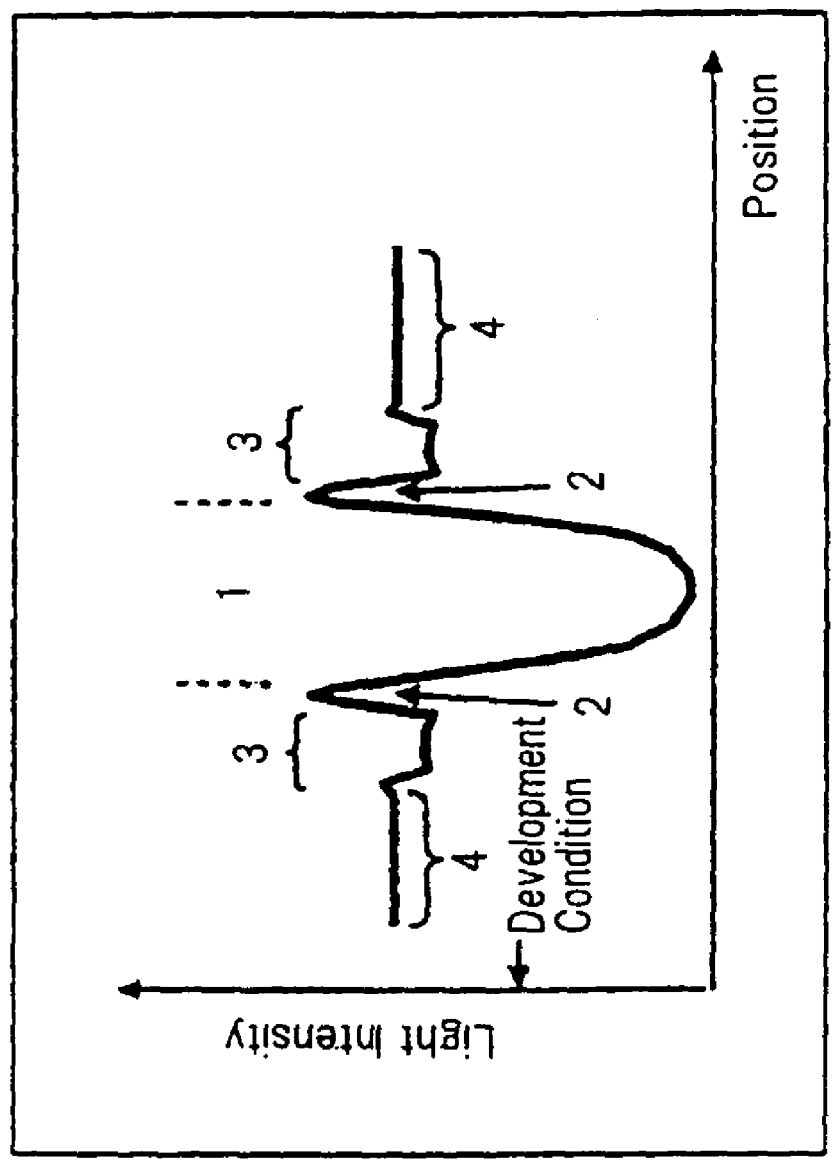
FIG. 5D is a graph showing the light intensity distribution of light rays on the surface of the substrate having passed through the patterns areas shown in FIG. 5A.

The light rays transmitted in this way have the light intensity distribution shown in FIG. 5D on the surface of the semiconductor substrate coated with a positive photoresist film. Whereas the possibility of arranging only one bar-shaped pattern, thinner than the resolvable minimum, was considered according to the art related to the invention, it has been found that the effect of restraining light rays which are diffracted and which stray in can be increased by making area 3 wider than was contemplated according to the art related to the invention.

Further, according to the art related to the invention no light shield is arranged and the transmissivity is 100% in its counterpart to area 4. Thus, these intense radiating rays were diffracted, and reached even the shaded part, in the terminology of geometrical optics, of the isolated main pattern to cause the pattern become thin.

According to the invention, unlike the above described situation, the transmission of light rays in area 4 is restrained to around 80% while keeping conditions that will prevent any resist pattern from being formed. This makes it possible to restrain the straying of light rays into the shade of the light shield in area 1, effectively suppress the thinning of the pattern formed in area 1 and eventually restrain the thinning of the isolated pattern relative to the dense patterns.

The auxiliary patterns formed in area 3 and area 4 are smaller in size than the resolvable minimum and, though they contribute to the adjustment of transmissivity, the auxiliary patterns themselves are not formed into resist patterns.

Besides, to form a positive-type photoresist hole pattern, the light transmissivity relationship among areas 1 through 4 is:

Area 2<area 4<area 3<area 1

A high-precision pattern can be formed by adjusting the light transmissivity by applying micro-patterns into area 3 and 4.

Moreover, a hole pattern or a bar-shaped pattern can be formed by using a negative-type photoresist.

Exemplary Embodiment 2

This exemplary embodiment pertains to pattern formation by transmissivity control on an attenuated halftone phase shift light shield and peripheral areas.

Figure 6A:
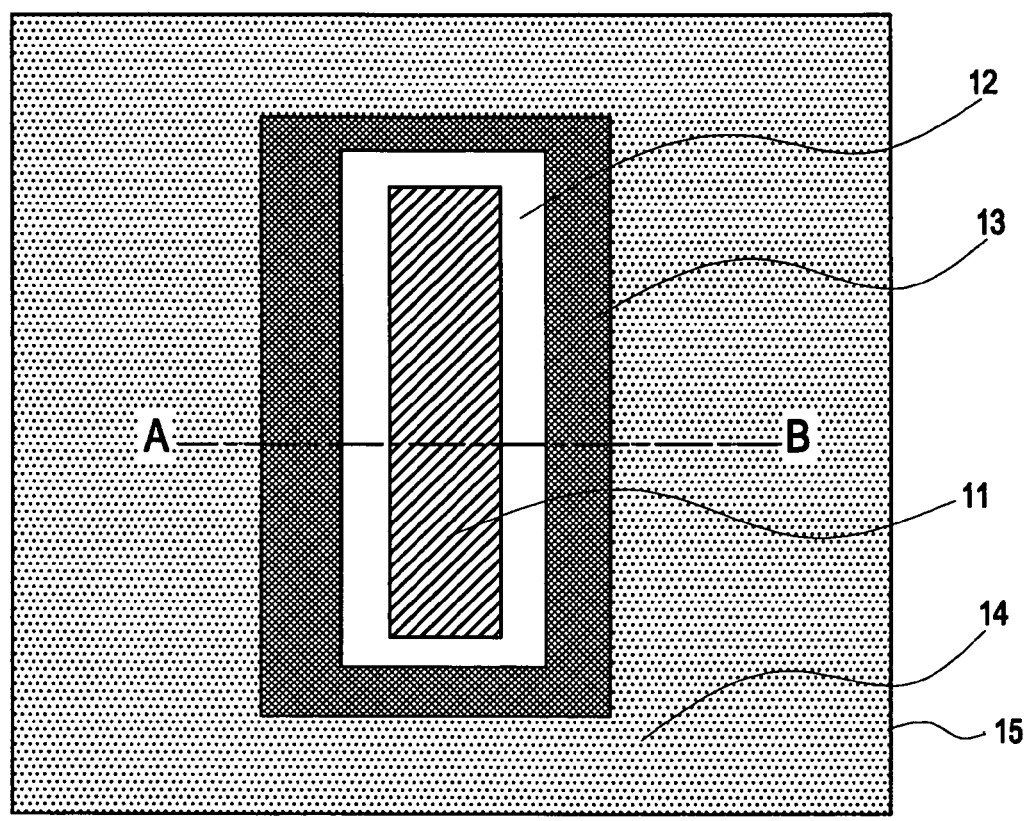
FIG. 6A is a plan showing the essential part of a photomask reticle in Exemplary Embodiment 2 of the invention.

FIG. 6A is a plan showing the essential part of a photomask reticle in this exemplary embodiment. In area 11 of transparent substrate 15, a light shield to make up the main pattern is arranged. Area 12, which is the highest in transmissivity, is arranged around area 11, and area 13 lower in transmissivity is arranged around outside area 12. The width of this area 13 is greater than that of the bar-shaped pattern according to the art related to the invention. Area 14 is arranged farther outside area 13. Area 14 has an intermediate transmissivity lower than area 12 but higher than area 13.

The transmissivity of area 11 can be selected from a range between approximately 3% and 15% to be suitable for the pattern to be formed. The phase of light rays to be transmitted by area 11 is so set as to have a difference of about a half phase from light rays to be transmitted by area 12.

Figure 6B:
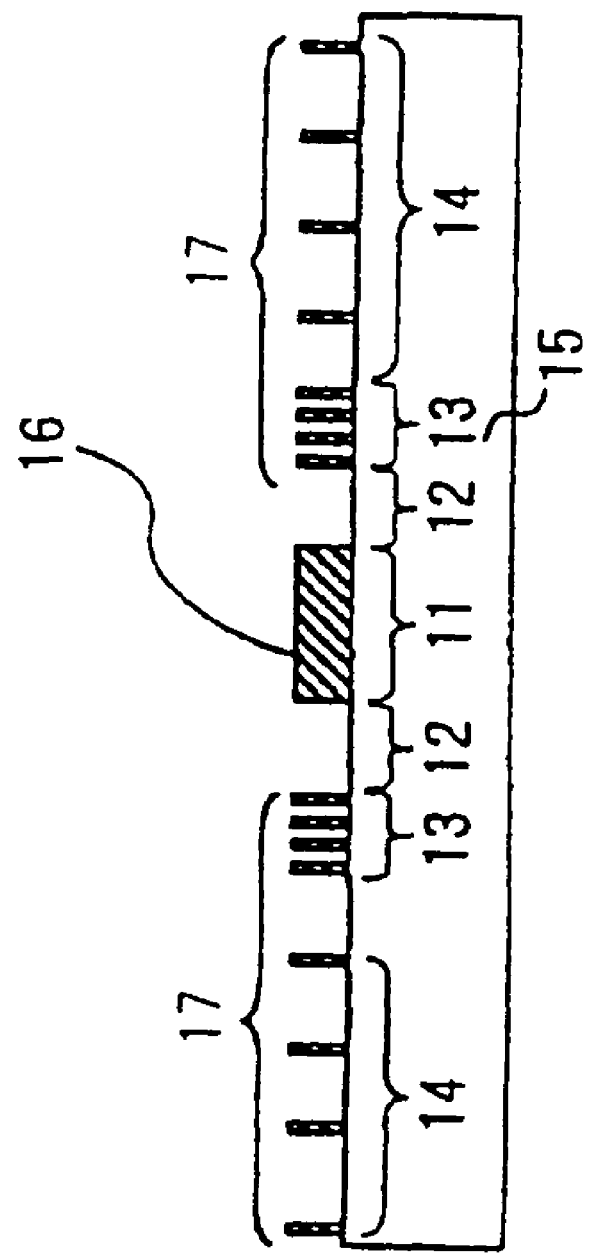
FIG. 6B shows a section along line A-B in FIG. 6A.

A section along line A-B in FIG. 6A is shown in FIG. 6B. Main pattern 16 made up of a light shield is formed in area 11 of substrate 15, and auxiliary patterns 17 are formed in area 13 and area 14. In area 12 that surrounds area 11, no light shield is arranged. Area 13 outside area 12 comprises micro-patterns which do not resolve but reduce the transmissivities of light rays. In area 14 farther outside area 13, micro-patterns are arranged in suitable size and at suitable intervals so that their substantial transmissivity is positioned at an intermediate value between those of area 12 and area 13.

Figure 6C:
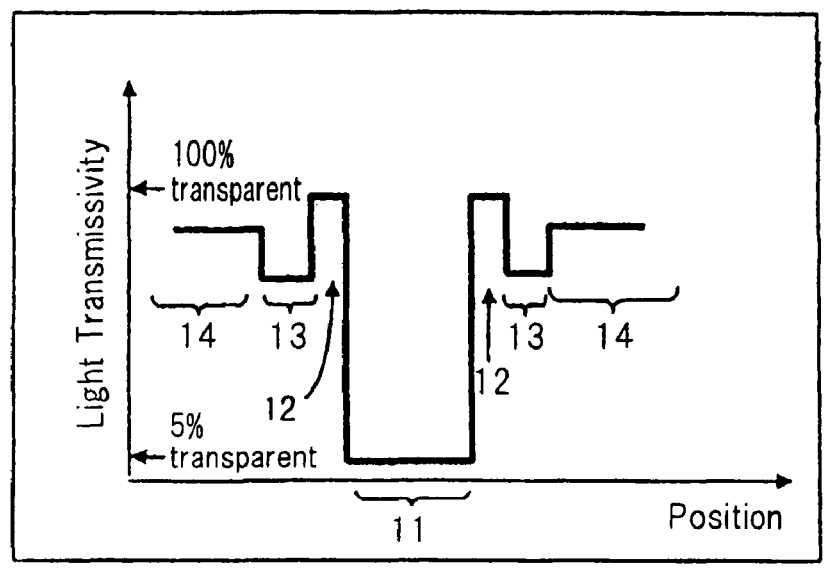
FIG. 6C is a graph showing the light transmissivity distribution of light rays having passed through the patterns areas shown in FIG. 6A.

Light rays having passed the patterns of FIG. 6A have light transmissivity distribution shown in FIG. 6C. Thus, the light transmissivity relationship among areas 11 through 14 is:

Area 12>area 14>area 13>area 11

Figure 6D:
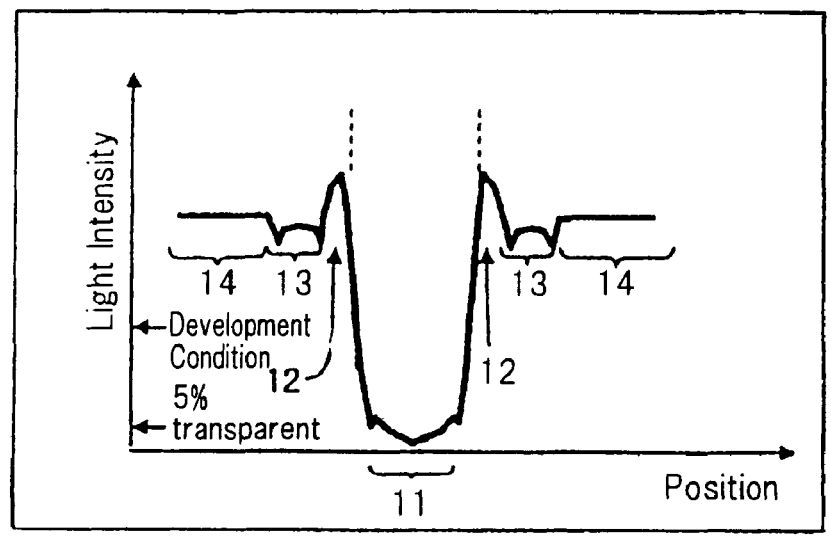
FIG. 6D is a graph showing light intensity distribution of light rays on the surface of the substrate having passed through the patterns areas shown in FIG. 6A.

The phase of light rays is a first phase for area 11 and area 13, and a second phase for area 12 and area 14. The first phase and the second phase have a difference of substantially half the wavelength. The light intensity distribution here is as shown in FIG. 6D. A condition is set so as to be suitable for a development threshold having a light intensity of approximately 50%.

Since light rays different in phase work so as to weaken the amplitude of each other on the boundary between area 11 and area 12, the edges of patterns that are formed are sharp. Further, since area 13 and area 14 weaken the transmitted light rays, the intensity of light rays straying into area 11 is reduced. These effects work to reduce pattern thinning in area 11.

In the case of this exemplary embodiment, by setting a condition that is suitable for keeping the light intensity at approximately 50% as shown in FIG. 6D, the dimensional difference between the dense patterns and the isolated pattern can be restrained, the depth of focus (DOF) can be increased and the range of appropriate exposure conditions can be broadened.

Exemplary Embodiment 3

This exemplary embodiment pertains to pattern formation by transmissivity control on a phase shift light shield and peripheral areas.

Figure 7A:
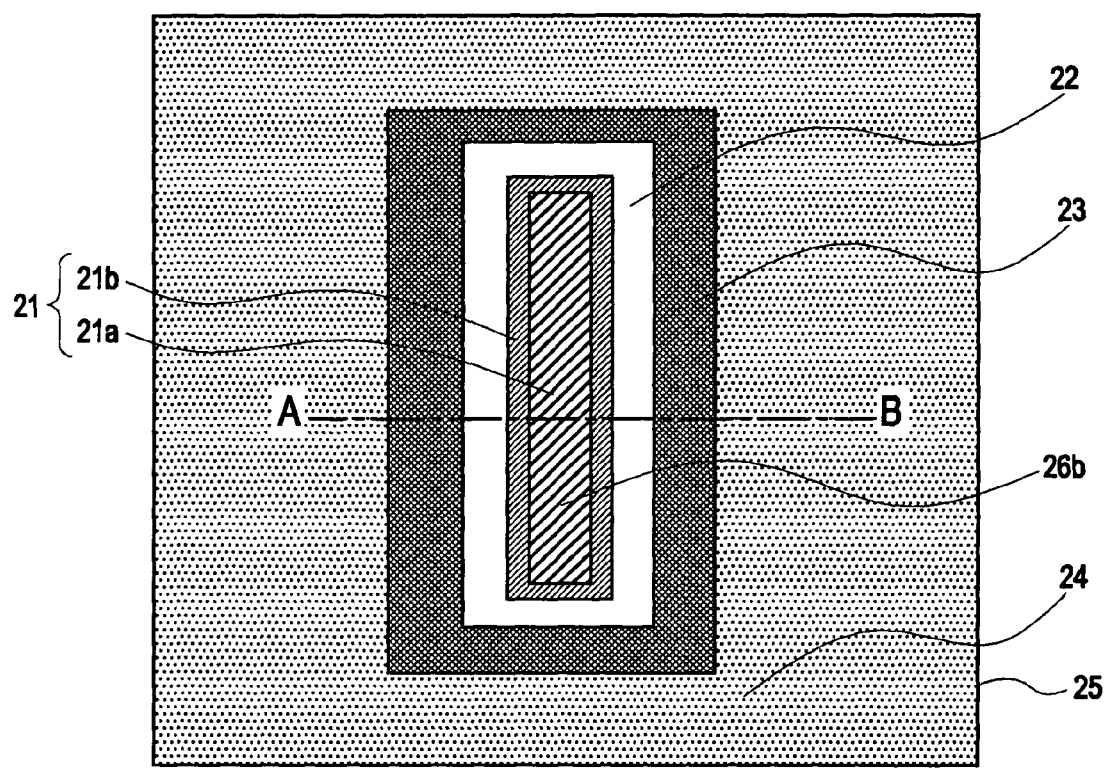
FIG. 7A is a plan showing the essential part of a photomask reticle in Exemplary Embodiment 3 of the invention.

FIG. 7A is a plan showing the essential part of a mask (reticle) having a phase shifter that is around a light shield in this exemplary embodiment.

Area 21 of substrate 25 has area 21a and area 21b. In area 21a, main pattern 26a made up of a light shield whose transmissivity is approximately 5% is formed. In area 21b that surrounds area 21a, phase shifter 26b is formed. In area 22 that surrounds area 21, no light shield is arranged.

Auxiliary patterns 27 are formed in area 23 and area 24. Area 23 outside area 22 comprises micro-patterns which do not resolve but which reduce the transmissivities of light rays. In area 24 farther outside area 23, micro-patterns are arranged in suitable size and at suitable intervals so that their substantial transmissivity is positioned at an intermediate value between those of area 22 and area 23.

It is preferable that the transmissivity of main pattern 26a be not above 7%, though not limited to 5%. The phase of light rays passing through area 21a in which main pattern 26a is formed is so set as to have a difference of substantially half the wavelength from that of light rays passing area 22.

Figure 7B:
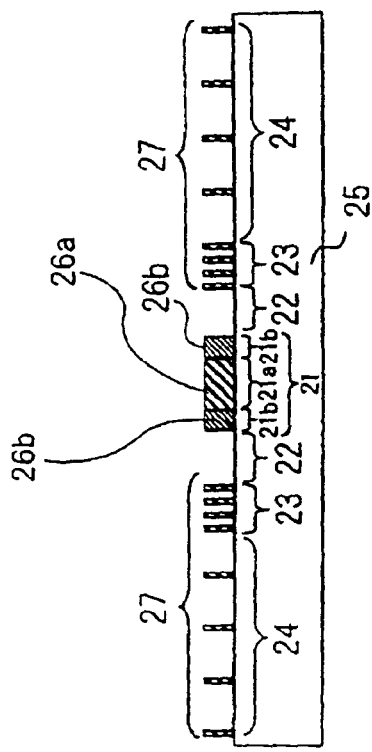
FIG. 7B shows a section along line A-B in FIG. 7A.

A section along line A-B in FIG. 7A is shown in FIG. 7B. Main pattern 26a in area 21a is made up of an attenuated halftone light shield or a light shield which substantially intercepts light, and area 21b around area 21a, is made up of phase shifter 26b having an attenuated halftone light shield. No light shield is arranged in area 22. Area 23 outside area 22 comprises micro-patterns which do not resolve but which reduce the transmissivities of light rays. In area 24 farther outside area 23, micro-patterns are arranged in suitable size and at suitable intervals so that their substantial transmissivity is positioned at an intermediate value between those of area 22 and area 23.

Figure 7C:
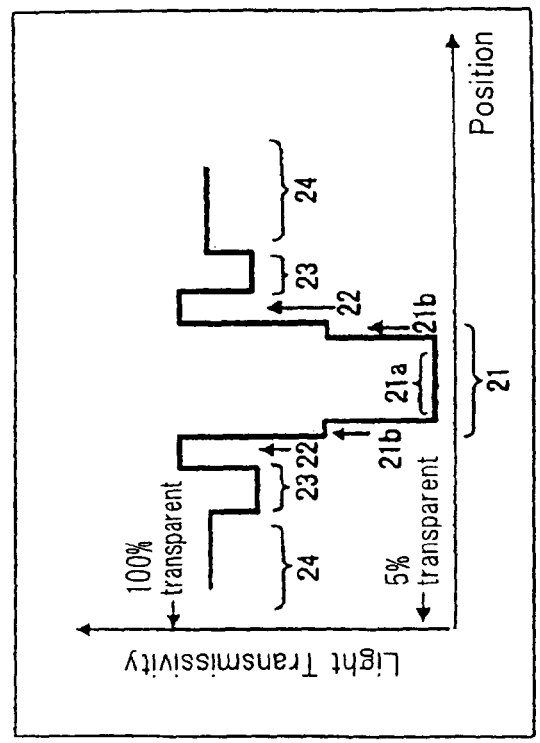
FIG. 7C is a graph showing light transmissivity distribution of light rays having passed through the patterns areas shown in FIG. 7A.

Light rays having passed through the patterns areas of FIG. 7A have light transmissivity distribution shown in FIG. 7C. Thus, the light transmissivity relationship among areas 21 through 24 is:

Area 22>area 24>area 23>area 21

Figure 7D:
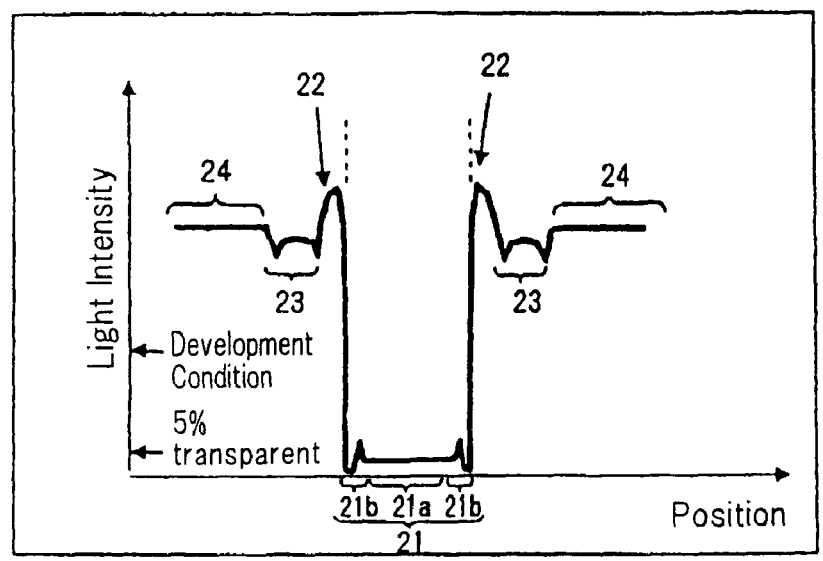
FIG. 7D is a graph showing light intensity distribution of light rays on the surface of the substrate having passed through the patterns areas shown in FIG. 7A.

The phase of light rays is a first phase for area 21 and area 23, and a second phase for area 22 and area 24. The first phase and the second phase have a difference of substantially half the wavelength. The light intensity distribution here is as shown in FIG. 7D. A condition is set so as to be suitable for a development threshold having a light intensity of approximately 50%.

Since light rays different in phase are caused to work so as to weaken the amplitude of each other on the boundary between area 21b and area 22 by enhancing the light transmissivity of area 21b, the edges of patterns that are formed are sharp. Further, because area 23 and area 24 weaken the transmitted light rays, the intensity of light rays straying into area 21 is reduced. These effects work to reduce pattern thinning in area 21.

In the case of this exemplary embodiment, by setting a condition suitable for keeping the light intensity at approximately 50% as shown in FIG. 7D, the dimensional difference between the dense patterns and the isolated pattern can be restrained, the depth of focus (DOF) can be increased and the range of appropriate exposure conditions can be broadened.

(Auxiliary Pattern)

Next auxiliary patterns 7, 17 and 27 formed in areas 3, 13 and 23, and in areas 4, 14 and 24, described with reference to Exemplary Embodiments 1 through 3, that will be further described. The following explanation will describe auxiliary patterns 7 formed in area 3 and area 4 by way of example.

Figure 8A:
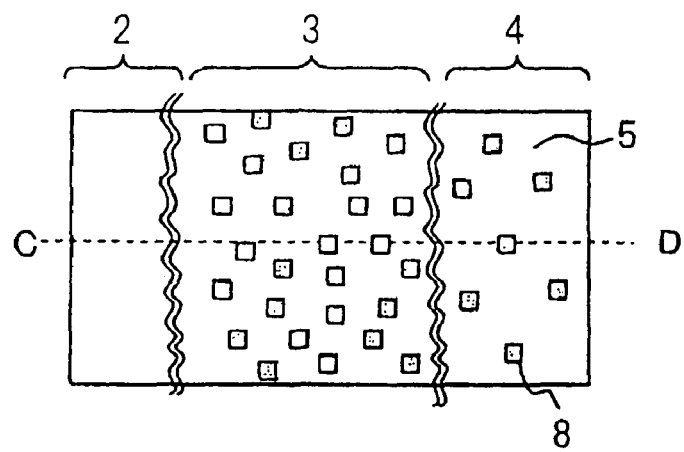
FIG. 8A is an example of a partially enlarged plan of a substrate showing unresolved micro light shields making up auxiliary patterns in area 3 and area 4 in FIGS. 5A-5C.
Figure 8B:
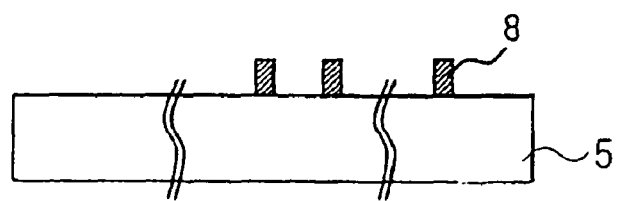
FIG. 8B shows a section of the reticle along line C-D in FIG. 8A.

FIG. 8A is a partially enlarged plan of substrate 5 unresolved micro light shields 8 making up auxiliary patterns 7 in area 3 and area 4. FIG. 8B shows a section along line C-D in FIG. 8A.

No micro light shield 8 is formed at all in area 2. Whereas a plurality of micro light shields 8 are formed in area 3 and area 4, more micro light shields 8 are formed in area 3 than in area 4. This makes area 3 higher in light transmissivity than area 1 in which light shields are formed and lower in transmissivity than area 2. Area 4 has a transmissivity level in the middle between those of area 2 and area 3.

Arranging a micro rectangular pattern or a combination of such shapes as micro light shield 8 is suitable for keeping the mask data quantity at an appropriate level. The shield may as well be circular or polygonal, but the number of data would then increase. The conceivable candidate length of one side of the rectangular pattern of micro light shields 8, for instance, is around 30% of the resolvable limit, and the shields are arrayed irregularly with random, because a slight deviation from regular arraying would make the effect of interference sufficiently small. The transmissivity can be defined by the ratio of the area of light interception by micro light shields 8 in a prescribed area in which one side of micro light shield 8 is not less than the approximate resolvable limit. In the case of an attenuated type, the transmissivity of the light shield may be further taken into account.

Figure 8C:
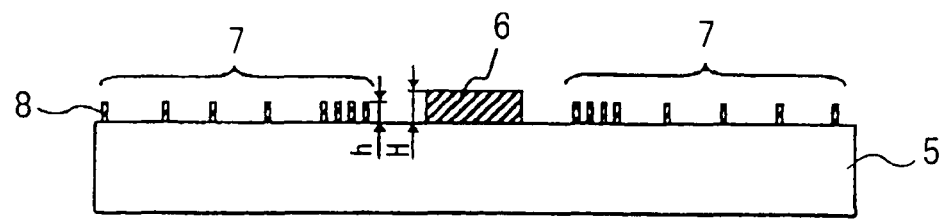
FIG. 8C shows a section of an example of a photomask reticle in which the main pattern and micro light shields making up the auxiliary patterns differ in height.
Figure 9A:
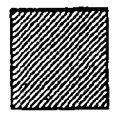
FIG. 9A shows an example of a shape selectable for the micro light shields in the invention.
Figure 9B:
FIG. 9B shows another example of a shape selectable for the micro light shields in the invention.
Figure 9C:
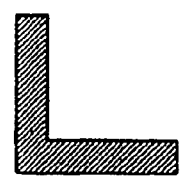
FIG. 9C shows still another example of a shape selectable for the micro light shields in the invention.
Figure 9D:
FIG. 9D shows still another example of a shape selectable for the micro light shields in the invention.
Figure 9E:
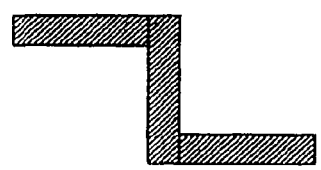
FIG. 9E shows still another example of a shape selectable for the micro light shields in the invention.
Figure 9F:
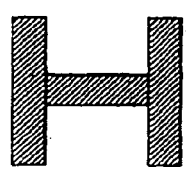
FIG. 9F shows still another example of a shape selectable for the micro light shields in the invention.
Figure 9G:
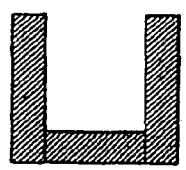
FIG. 9G shows still another example of a shape selectable for the micro light shields in the invention.
Figure 9H:
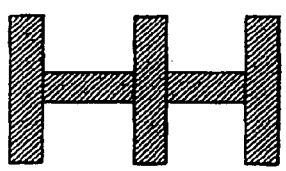
FIG. 9H shows still another example of a shape selectable for the micro light shields in the invention.
Figure 9I:
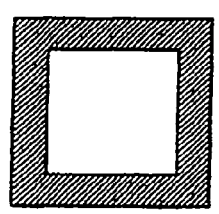
FIG. 9I shows still another example of a shape selectable for the micro light shields in the invention.
Figure 9J:
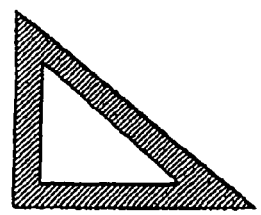
FIG. 9J shows still another example of a shape selectable for the micro light shields in the invention.

FIG. 8C is a sectional view matching FIG. 8B. Height h of micro light shields 8 constituting auxiliary patterns is set to be lower than height H of main pattern 6. By keeping height h of micro light shields 8 for transmissivity adjustment low in this way, micro light shields 8 can be prevented from falling down during the reticle fabrication process.

One or another of various shapes shown in FIG. 9A through FIG. 9J can be selected for micro light shields 8.

It is preferable that, as a rough yardstick, the width of micro light shields 8, that is used here, be not more than 30% of the pattern to be resolved. It is further preferable that each micro light shield 8 have a bottom that is in contact with substrate 5 and a top face similar in shape. Micro light shields 8 may have one of the shapes shown in FIG. 9C through FIG. 9J, including the combination of bar-shaped patterns and a polygon whose inside portion is cut out in addition to the rectangular patterns shown in FIG. 9A and FIG. 9B. Such a shape would enhance the strength of contact of the bottoms of micro light shields 8 with the substrate and thereby serve to improve the manufacturing yield. The shapes of these micro light shields 8 as projected in the direction normal to the main face of the substrate may include congruent or similar ones.

Figure 10A:
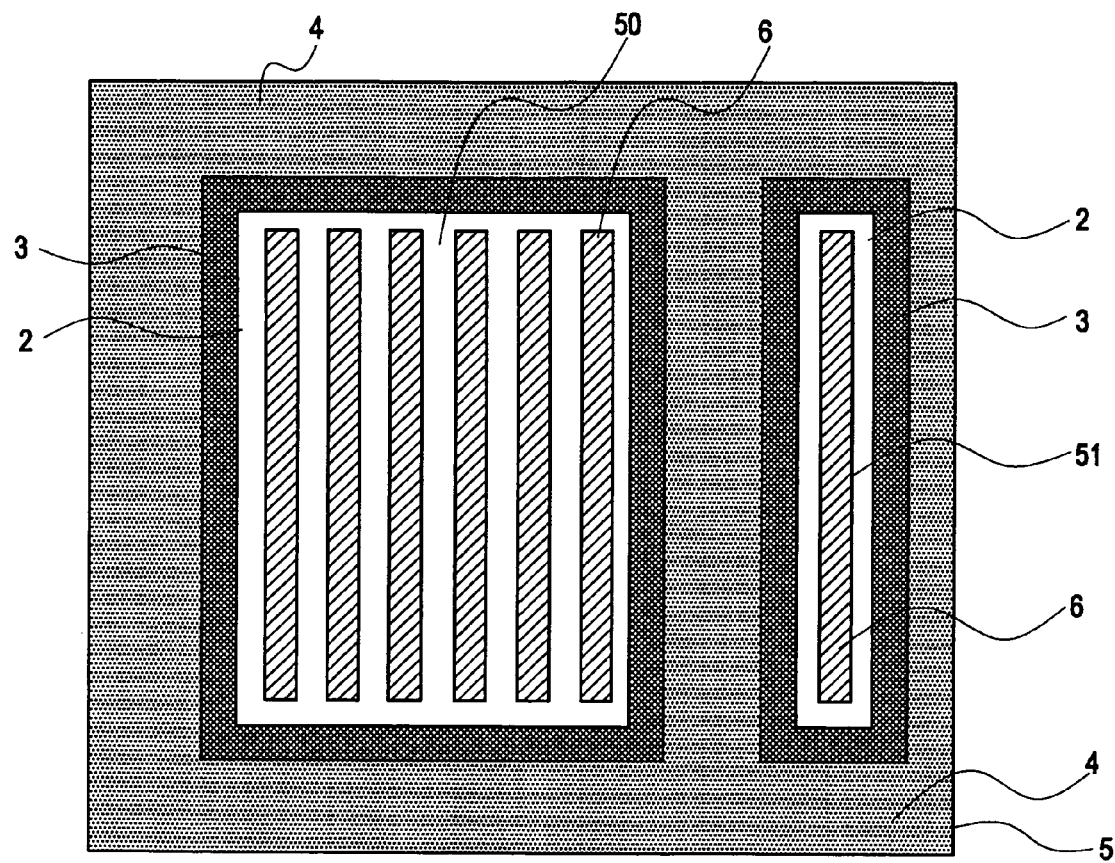
FIG. 10A is a plan showing an example of applying of Exemplary Embodiment 1 of the invention to a photomask reticle having dense and isolated patterns.

FIG. 10A is a plan showing an example of a photomask reticle in which the transmissivity adjusting patterns shown with reference to Exemplary Embodiment 1 of the invention is applied to dense and isolated patterns.

In substrate 5, dense pattern 50, comprising densely concentrated main patterns 6 that are formed in a plurality of areas 1, and isolated pattern 51 of single main pattern 6 that is formed in one area 1 that is independently formed apart from dense pattern 50, are formed.

Around isolated pattern 51, areas 2, 3 and 4, as transmissivity adjusting patterns, are formed. Regarding dense pattern 50, areas 2, 3 and 4, are formed so as to surround the whole dense pattern.

Figure 10B:
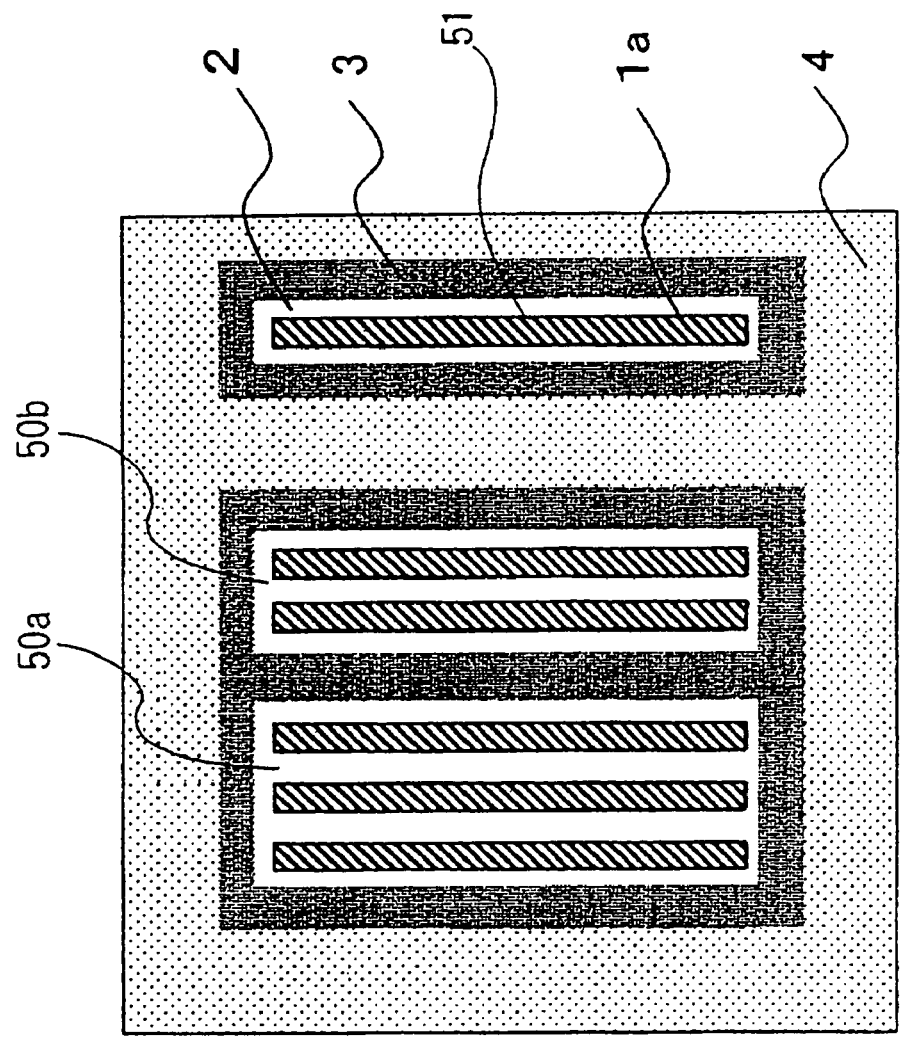
FIG. 10B is a plan showing another example of applying of Exemplary Embodiment 1 of the invention to a photomask reticle having dense and isolated patterns.

Another example of a configuration having dense patterns and an isolated pattern is shown in FIG. 10B. The dense patterns shown in FIG. 10B comprise dense pattern 50a and dense pattern 50b. Main patterns 6 in dense pattern 50 shown in FIG. 10A are arranged close to one another. Unlike them, dense pattern 50a and dense pattern 50b are formed in independent positions apart from each other. In FIG. 10B, dense patterns 50a and 50b have a gap about equal to one main pattern 1 between them. Thus, where the patterns are spaced at only about the width of area 3, no area 4 may be formed between dense pattern 50a and dense pattern 50b, but area 3 may be formed instead.

The light transmissivity is adjusted by arranging micro-patterns in area 3 to have the substantial light transmissivity relationship:

Area 2>area 3>area 1

This light transmissivity may have a substantial uniformity or a nonuniform distribution with an inclination. In these areas, various light transmissivity distributions can be formed by arranging micro-patterns. The light transmissivity at the boundary of each area may be changed stepwise or may be changed continuously and smoothly.

According to the invention, desired light transmissivity distributions can be applied to a photomask reticle. Therefore, the effect of the optical correction of the photomask reticle of the present invention is enhanced as compared with a photomask reticle having uniform light transmissivity. As a result, the present invention can reduce the manufacturing cost for semiconductor device.

Figure 11A:
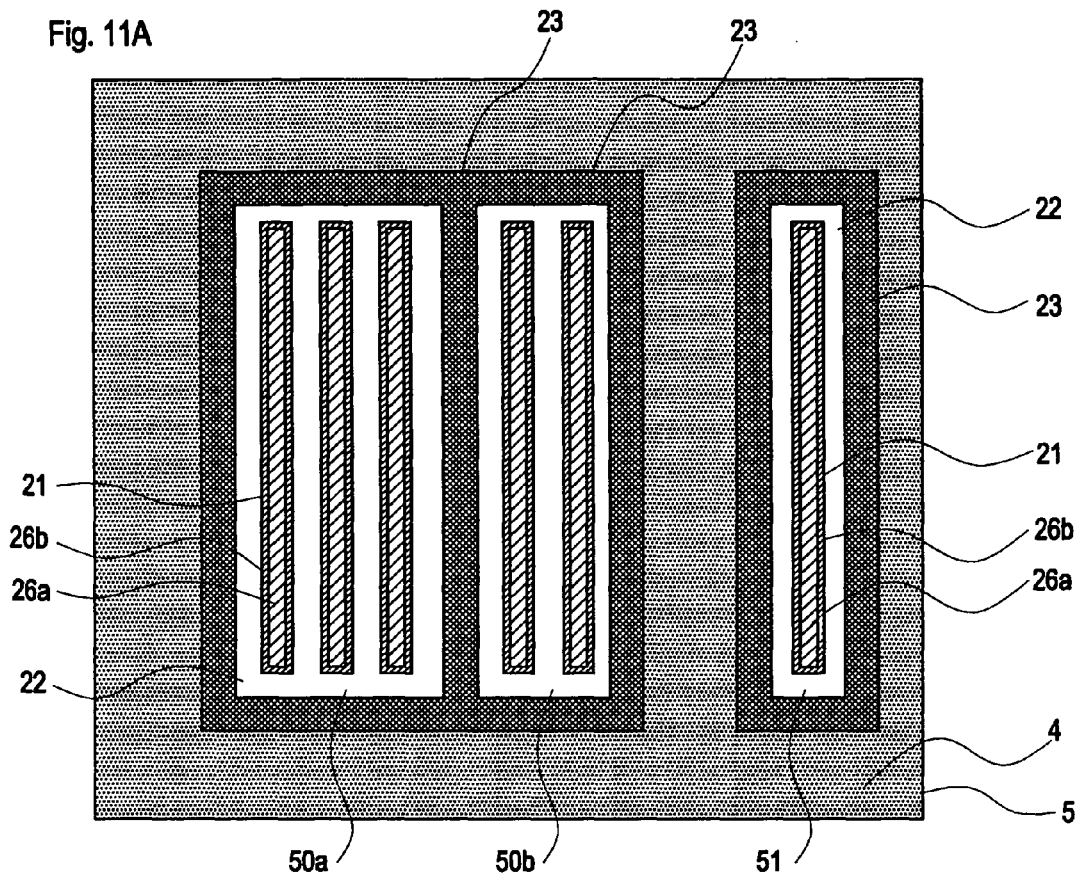
FIG. 11A is a plan showing another example of applying of Exemplary Embodiment 3 of the invention to a photomask reticle having dense and isolated patterns.
Figure 11B:
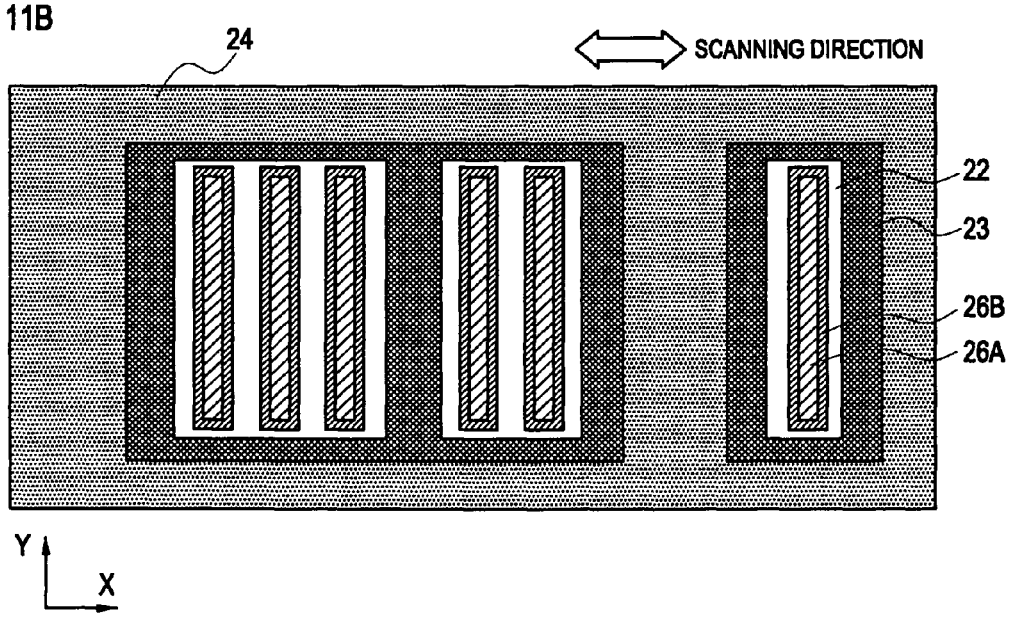
FIG. 11B is a plan of a photomask reticle in which a pattern ratio that is different in the scanning direction from the pattern ratio is formed on a semiconductor substrate.

FIG. 11A is a plan showing an example of a photomask reticle in which the transmissivity adjusting patterns shown with reference to Exemplary Embodiment 3 of the invention are arranged. On the other hand, FIG. 11B shows a photomask reticle enlarged in a varied aspect ratio relative to the conventional mask. Incidentally, FIG. 11B shows an application of Exemplary Embodiment 3 by way of example. A desired pattern is formed by adjusting the extent of movement of the reticle and that of the substrate at the time of scanning exposure. By setting the pattern ratio of areas 1 through 4 in the scanning direction to be greater than that of the resist pattern on the semiconductor substrate in the scanning direction, this resist pattern being obtained, the pattern accuracy in the scanning direction can be enhanced.

Figure 12B:
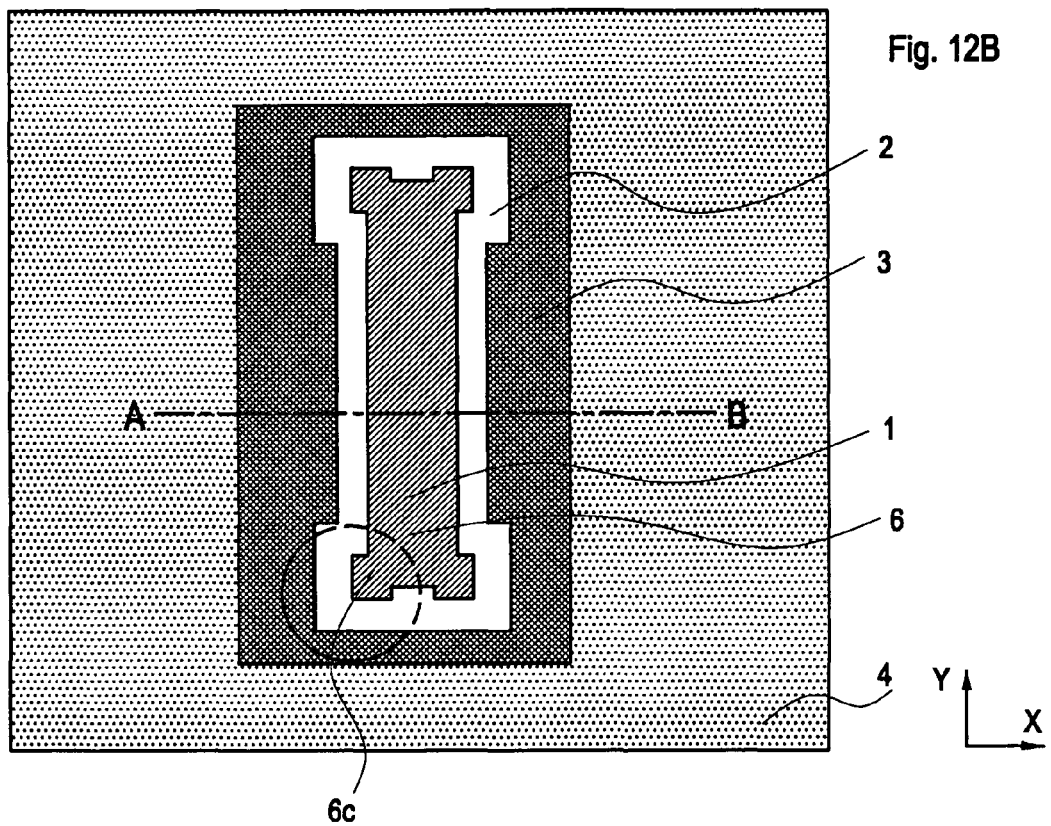
FIG. 12B is a plan showing another example of a photomask reticle according to the invention having a main pattern whose corner shape is corrected.
Figure 12A:
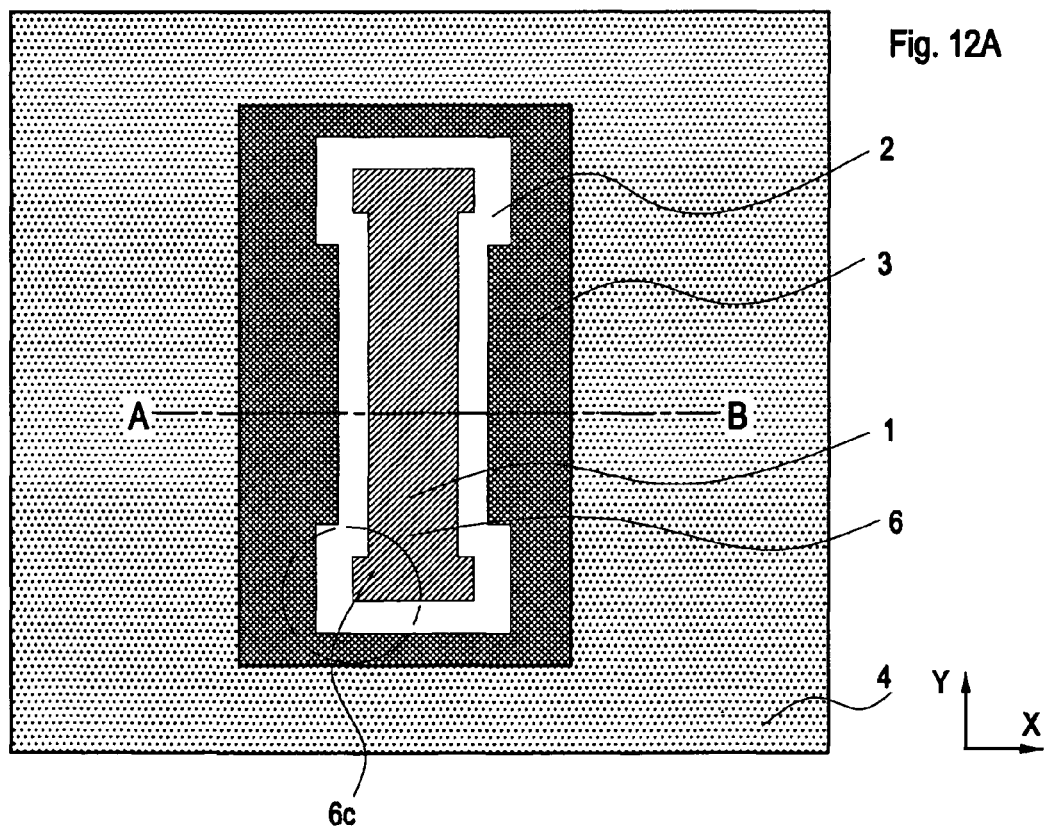
FIG. 12A is a plan showing an example of a photomask reticle according to the invention having a main pattern whose corner shape is corrected.

As a modification of the invention, the corner shape of the main pattern can be corrected in advance. Examples of this correction are shown in FIG. 12A and FIG. 12B. FIG. 12A shows a case in which convexes 6c that extend in the X direction are formed at corners of main pattern 6. The shapes of area 2 and area 3 also conform to the shape of convexes 6c.

In this way, the invention permits the combined use of the transmissivity adjusting pattern with the main pattern whose shape is corrected.

(Reticle Manufacturing Method)

Next, a photomask reticle manufacturing method according to the invention will be described with reference to FIG. 13A through FIG. 13E.

Figure 13A:
FIG. 13A is a process diagram showing a photomask reticle manufacturing method according to the invention.

First, light shielding layer 100 (metal layer, silicide layer or the like) is formed over substrate 5 that has high transmissivity (FIG. 13A).

Then, intermediate mask layer 101 (e.g. amorphous carbon layer) is formed over light shielding layer 100.

Figure 13B:
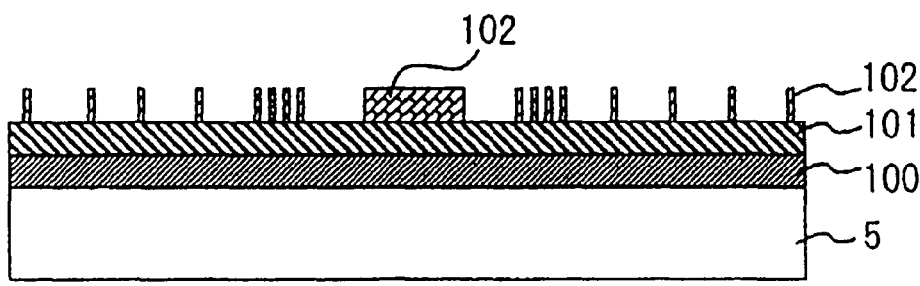
FIG. 13B is another process diagram showing the reticle manufacturing method according to the invention.

After further forming a photoresist layer over intermediate mask layer 101, electron ray drawing exposure is conducted to form resist mask 102 for forming a main pattern and auxiliary patterns (FIG. 13B).

Figure 13C:
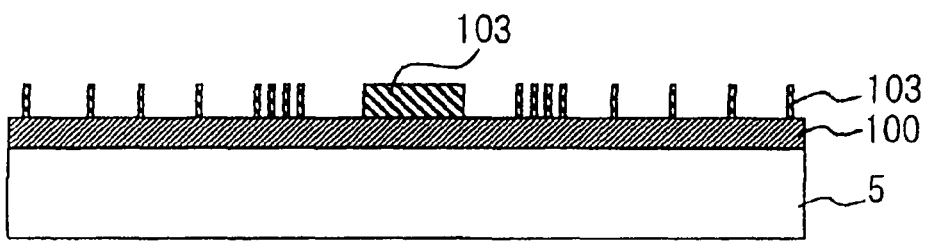
FIG. 13C is another process diagram showing the reticle manufacturing method according to the invention.

Next, resist mask 102 is transferred to intermediate mask layer 101 to form intermediate mask pattern 103 (FIG. 13C).

Figure 13D:
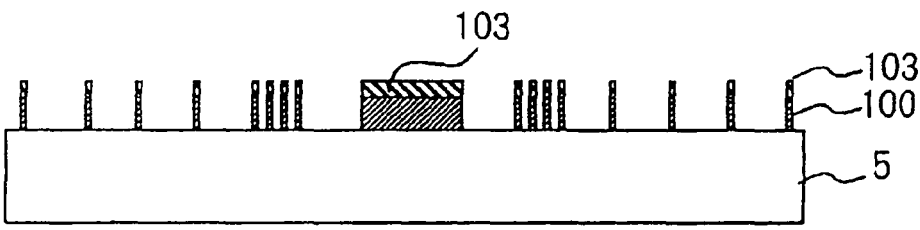
FIG. 13D is another process diagram showing the reticle manufacturing method according to the invention.

Further, intermediate mask pattern 103 is transferred to light shielding layer 100 (FIG. 13D).

Figure 13E:
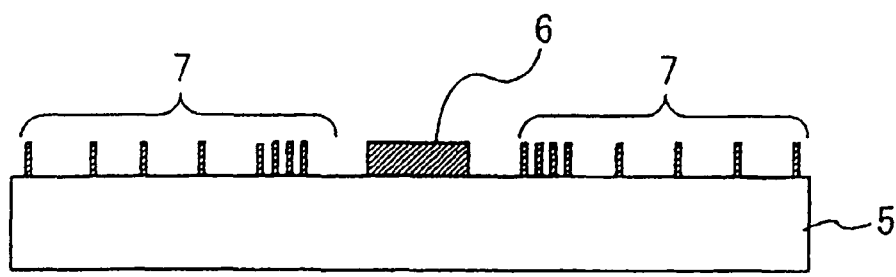
FIG. 13E is another process diagram showing the reticle manufacturing method according to the invention.

Finally, intermediate mask pattern 103 composed of amorphous carbon is removed by ashing to form a photomask reticle having main pattern 6 and auxiliary pattern 7 (FIG. 13E).

A manufacturing method using intermediate mask layer 101 was described above. However, where machining of light shielding layer 100 does not involve substantial difficulty, intermediate mask layer 101 may be dispensed with and resist mask 102 may be directly transferred to light shielding layer 100.

Figure 14:
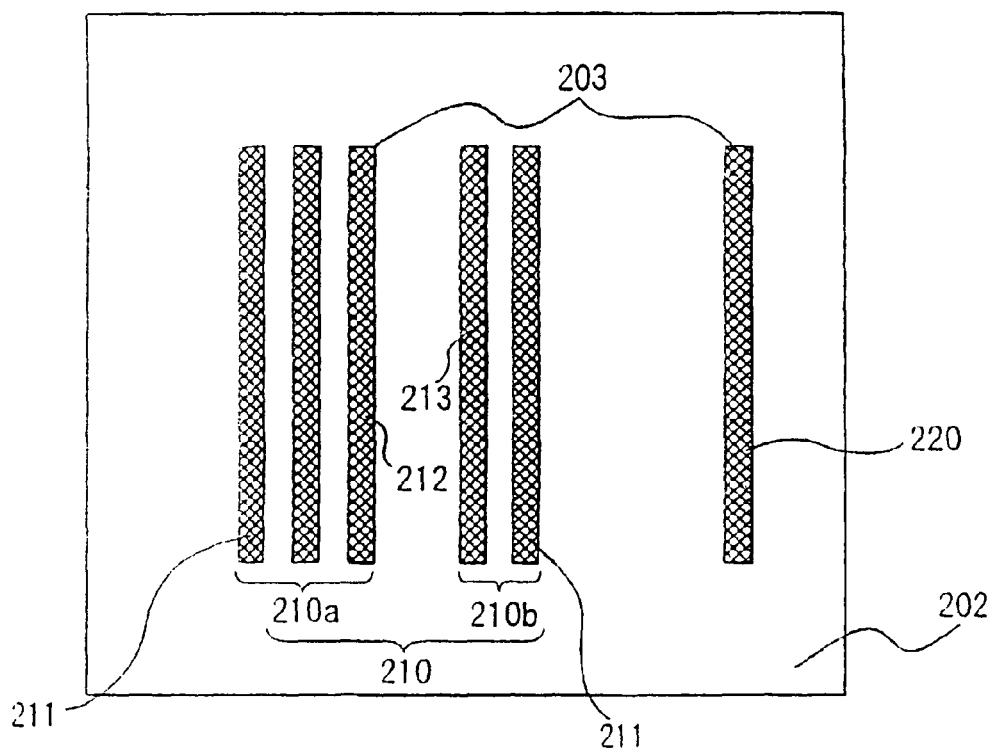
FIG. 14 is a plan of a semiconductor device in which resist patterns are formed by using the reticle according to the invention.

Next, a semiconductor device manufacturing method will be described with reference to FIG. 14 and FIG. 15. FIG. 14 is a plan of a semiconductor device in which resist patterns have been transferred by using the reticle shown in FIG. 10B, and FIG. 15 is a sectional view of the semiconductor device shown in which the resist patterns shown in FIG. 14 are formed.

First, inter-layer insulating film 201 made up of $SiO_2$ is formed over semiconductor substrate 200, and workable film 202 is formed over the insulating film. Workable film 202 is a layer formed by stacking $SiO_2$ over TiN/AlCu/TiN/Ti.

Resist patterns 203 are transferred onto workable film 202 by using the reticle shown in FIG. 10B to achieve the state shown in FIG. 14 and FIG. 15. Thus, dense patterns 210 including first dense patterns 210a and second dense patterns 210b and isolated pattern 220 formed in a position away from these dense patterns 210 are formed as resist patterns 203 over workable film 202.

Referring to FIG. 14 which is a schematic illustration, first dense patterns 210a and second dense patterns 210b are formed with a gap between each other about as wide as one pattern, and dense patterns 210 and isolated pattern 220 are apart from each other by at least two patterns. Although auxiliary patterns made up of transmissivity adjusting micro light shields 8 are formed in area 3 and area 4 of the reticle shown in FIG. 10B, only the main pattern is formed over workable film 202, but not auxiliary patterns made up of micro light shields 8.

Further, since the straying-in of light due to diffraction is restrained by the auxiliary patterns in areas 3 and 4, thinning of the resist pattern can be suppressed. Thus, pattern 211 that is the outermost of dense patterns 210 is formed without becoming thinner than isolated pattern 220. Furthermore, pattern 212 that is the outermost of first dense patterns 210a and that is opposite second dense pattern 210b is also formed without thinning. Similarly, pattern 213 that is the outermost of second dense pattern 210b and that is opposite first dense pattern 210a is also formed without thinning.

While preferred embodiments of the present invention have been described using specific terms, such description is for illustrative purposes only, and it is to be understood that changes and variations may be made without departing from the spirit or scope of the following claims.

What is claimed is:

1. A photomask reticle for use in projection exposure to form a resist pattern on a workable film formed over a semiconductor substrate, comprising:
   a first area in which a light shield is formed;
   a second area formed around said first area;
   a third area formed around said second area; and
   a fourth area formed around said third area, the areas being formed over a substrate, a relationship between transmissivities of said areas being second area transmissivity>fourth area transmissivity>third area transmissivity>first area transmissivity.

2. The reticle according to claim 1, wherein said first area comprises:
   a first part including dense patterns including a plurality of light shields which are formed adjacent to one another; and
   a second part including an isolated pattern including one light shield, wherein said dense patterns and said isolated pattern are independently formed in positions apart from each other.

3. The reticle according to claim 1, wherein a plurality of unresolved micro light shields are arranged in said third area and said fourth area.

4. The reticle according to claim 3, wherein said plurality of unresolved micro light shields are randomly arranged.

5. The reticle according to claim 3, wherein the shapes of said plurality of unresolved micro light shields as projected in the direction normal to the main face of said substrate include congruent shapes or similar shapes.

6. The reticle according to claim 3, wherein a height of said plurality of unresolved micro light shields is less than a height of said light shield in said first area.

7. The reticle according to claim 3, wherein said first area comprises a halftone including a plurality of light shields having an attenuated phase part not less than 3% but not more than 12% in transmissivity, and light rays passing through said plurality of light shields of said halftone and light rays passing through said second area are different in phase.

8. The reticle according to claim 3, wherein said light shield in said first area comprises a plurality of light shields differing in transmissivity, and said plurality of light shields are arranged such that their transmissivity increases in a direction towards said second area.

9. A method of manufacturing the reticle for use in projection exposure according to claim 1, comprising:

forming a light shield layer over said substrate;
forming a resist layer over said light shield layer;
forming, in said resist layer, a resist mask having patterns which form said first area, said third area and said fourth area; and
removing said resist layer after transferring said patterns formed by said resist mask to said light shield layer.

10. A method of manufacturing the reticle for use in projection exposure according to claim 1, comprising:
   forming a light shield layer over said substrate;
   forming an intermediate mask layer over said light shield layer;
   forming a resist layer over said intermediate mask layer;
   forming, in said resist layer, a resist mask having patterns which form said first area, said third area and said fourth area;
   removing said resist layer after transferring said patterns formed by said resist mask to said intermediate mask layer; and
   removing said intermediate mask layer after further transferring to said light shield layer said patterns transferred to said intermediate mask layer.

11. The reticle according to claim 1, wherein the third area comprises a plurality of randomly arranged micro light shields.

12. The reticle according to claim 1, wherein the fourth area comprises a plurality of randomly arranged micro light shields, a number of the plurality of micro light shields in the third area being greater than a number of the plurality of micro light shields in the fourth area.

13. The reticle according to claim 12, wherein a bottom of the plurality of micro light shields contacts the substrate and comprises a shape which is similar to a shape of a top of the plurality of micro light shields.

14. The reticle according to claim 1, wherein the first area comprises a first part comprising a main pattern which includes the light shield, and a second part comprising a phase shifter formed around a periphery of the main pattern.

15. The reticle according to claim 14, wherein light rays to be transmitted by the first and third areas has a first phase, and light rays to be transmitted by the second and fourth areas has a second phase which is different from the first phase.

16. The reticle according to claim 14, wherein a phase of light rays passing through the first part of the first area has a difference of substantially half the wavelength from a phase of light rays passing through the second part of the first area.

17. The reticle according to claim 1, wherein the fourth area comprises a plurality of randomly arranged micro light shields which are formed around an entire periphery of the third area.

18. A photomask reticle, comprising:
   a first portion comprising a substrate and a light shield formed on the substrate, the first portion having a first transmissivity;
   a second portion formed around the first portion and having a second transmissivity;
   a third portion formed around the second portion and having a third transmissivity which is greater than the first transmissivity; and
   a fourth portion formed around the third portion and having a fourth transmissivity which is greater than the third transmissivity and less than the second transmissivity.

* * * * *